United States Patent
Murakami et al.

(10) Patent No.: US 7,550,782 B2
(45) Date of Patent: Jun. 23, 2009

(54) SEMICONDUCTOR DEVICE HAVING AN UNDERCOAT LAYER AND METHOD OF MANUFACTURING THE SAME

(75) Inventors: Masanori Murakami, Kyoto (JP); Teppei Watanabe, Kyoto (JP); Susumu Tsukimoto, Kyoto (JP); Kazuhiro Ito, Kyoto (JP); Jun Ito, Aichi (JP); Miki Moriyama, Aichi (JP); Naoki Shibata, Aichi (JP)

(73) Assignee: Toyoda Gosei Co., Ltd., Nishikasugai-gun, Aichi (JP)

( * ) Notice: Subject to any disclaimer, the term of this patent is extended or adjusted under 35 U.S.C. 154(b) by 55 days.

(21) Appl. No.: 11/233,113

(22) Filed: Sep. 23, 2005

(65) Prior Publication Data
US 2006/0065898 A1    Mar. 30, 2006

(30) Foreign Application Priority Data
Sep. 27, 2004    (JP)    ............... P2004-278875

(51) Int. Cl.
*H01L 31/0224*    (2006.01)
(52) U.S. Cl. ............ 257/190; 257/86; 257/91; 257/98; 257/631; 257/764; 257/770; 257/E31.124
(58) Field of Classification Search ........... 257/12, 257/85, 94, 189, 190, 200, 629, 631, E33.027, 257/E33.028, E21.116, E21.125, 86, 91, 257/98, 764, 770, E31.019, E31.11, E31.124; 438/656, 685
See application file for complete search history.

(56) References Cited

U.S. PATENT DOCUMENTS

| | | | |
|---|---|---|---|
| 6,426,512 B1* | 7/2002 | Ito et al. | 257/12 |
| 2002/0047205 A1* | 4/2002 | Trivedi et al. | 257/757 |
| 2005/0151255 A1* | 7/2005 | Ando et al. | 257/750 |

FOREIGN PATENT DOCUMENTS

| JP | 2000-77712 | 3/2000 |
|---|---|---|
| JP | 2000-114597 | 4/2000 |
| JP | 2002-43617 | 2/2002 |

OTHER PUBLICATIONS

F.A. Ponce, et al., "Determination of lattice polarity for growth on GaN bulk single crystals and epitaxial layers", Applied Physics Letter, vol. 69, No. 3, Jul. 15, 1996.

* cited by examiner

Primary Examiner—Matthew Smith
Assistant Examiner—Julio J Maldonado
(74) Attorney, Agent, or Firm—McGinn IP Law Group, PLLC

(57) ABSTRACT

In a semiconductor device in which a group III nitride compound semiconductor layer is formed without a low temperature grown buffer layer provided on an undercoat layer formed by a metal nitride layer, the metal nitride layer is formed of reddish brown titanium nitride. The reddish brown titanium nitride can be obtained by causing nitrogen to be rich in the titanium nitride.

7 Claims, 5 Drawing Sheets

SEMICONDUCTOR DEVICE HAVING AN UNDERCOAT LAYER AND METHOD OF MANUFACTURING THE SAME

This application is based on Japanese Patent Application No. 2004-278875, which is incorporated herein by reference.

BACKGROUND OF THE INVENTION

1. Field of the Invention

The present invention relates to a semiconductor device and a method of manufacturing the semiconductor device.

2. Description of the Related Art

In order to manufacture a group III nitride compound semiconductor device, conventionally, the utilization of a metal nitride layer as an undercoat layer has been proposed to obtain a group III nitride compound semiconductor layer having an excellent crystal.

Since the metal nitride layer has a conductivity, it can be used as an electrode.

In an undercoat layer formed of the metal nitride, a low temperature grown (a growth temperature: 400° C.) buffer layer (an AlN layer) is provided between the undercoat layer and a group III nitride compound semiconductor layer in order to maintain the excellent crystallinity of the group III nitride compound semiconductor layer to be grown thereon.

For the foregoing, see JP-A-2002-43617, JP-A-2000-77712 and JP-A-2000-114597.

It is preferable that the laminating structure of a semiconductor layer in a semiconductor device should be as simple as possible. A manufacturing process can be simplified and the yield of a semiconductor device can be enhanced, and a manufacturing cost can be reduced. Consequently, an inexpensive semiconductor device can be provided.

Moreover, the buffer layer has an insulating property depending on a material thereof. For this reason, a so-called conductivity in a vertical direction cannot be taken in the semiconductor device. In order to form an electrode, therefore, it is necessary to carry out etching for the semiconductor device. Also in this respect, the presence of the buffer layer can be a factor in an increase in the manufacturing cost of the semiconductor device.

SUMMARY OF THE INVENTION

The invention has been made to solve the problems. More specifically, there is provided a semiconductor device comprises a group III nitride compound semiconductor layer, and an undercoat layer comprises metal nitride, wherein the group III nitride compound semiconductor layer is formed on the undercoat without a low temperature grown buffer layer provided therebetween. Incidentally, the metal nitride layer is formed of reddish brown titanium nitride.

In the semiconductor device thus constituted, it is possible to grow the group III nitride compound semiconductor layer having an excellent crystallinity on an undercoat layer without providing the buffer layer between the undercoat layer and the group III nitride compound semiconductor layer. Accordingly, the laminating structure of the semiconductor layer in the semiconductor device can be simplified.

DETAILED DESCRIPTION OF THE PREFERRED EMBODIMENTS

Figure 1:
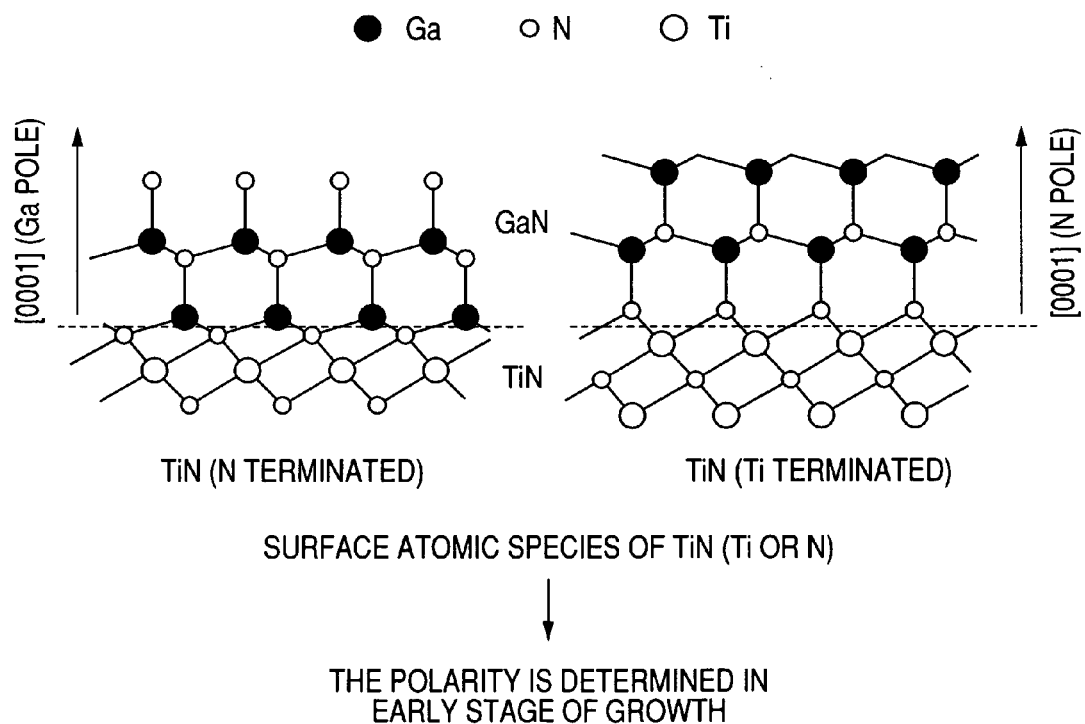
FIG. 1 is a view showing a relationship between the polarity of an undercoat layer and the growth manner of a group III nitride compound semiconductor layer.

Reddish brown titanium nitride (TiN) has nitrogen (N) richer by 10 to 20% than gold titanium nitride. By making the nitrogen rich in the undercoat layer, a large number of N atoms appear over a surface thereof, that is, the polarity of the surface of the undercoat layer is unified. As a result, the growth of the group III nitride compound semiconductor is started at a gallium (Ga) pole (see FIG. 1). In the configuration in which the growth is thus started at the Ga pole, there has been known that a suitable crystallinity (particularly, a surface flatness) for the group III nitride compound semiconductor is obtained (see F. A. Ponce, D. P. Bour, W. T. Young M. Saunders, and J. W. Steeds: Applied Physics Letter, 69 (1996) 337).

If the undercoat layer formed of titanium nitride is titanium-rich, the color of the undercoat layer does not have a reddish brown color but a silver color. In this state, a group III nitride compound semiconductor layer having a suitable crystallinity cannot be grown directly on the undercoat layer. In other words, therefore, a low temperature grown buffer layer has conventionally been required. This can be supposed because a nitrogen atom and a titanium atom appear on the surface of the undercoat layer so that the polarity of the undercoat layer is not unified.

A method of making the nitrogen rich in the titanium nitride can be selected optionally. For example, the nitrogen is made rich in the formation of the undercoat layer. For example, in the case in which the undercoat layer is formed by sputtering, the flow rate of a nitrogen gas is increased. By forming the undercoat layer and then carrying out nitriding, moreover, it is also possible to increase a nitrogen component in the undercoat layer. The nitriding indicates any method to be intentionally carried out in order to increase the nitrogen component in the undercoat layer. Examples include a method of heating the undercoat layer while causing an ammonia gas to flow. When the group III nitride compound semiconductor layer is grown by a MOCVD method, moreover, the ammonia gas is caused to flow as a material gas. If the supply of the material gas of a group III element is delayed at this time, the undercoat layer is consequently subjected to the nitriding. In addition, thermal nitriding to be carried out by the flow of a high purity nitrogen gas at a high temperature can be taken as an example of the method of nitriding an undercoat layer.

The titanium nitride can make the nitrogen rich as long as a crystallinity thereof is obtained.

As described above, the titanium oxide can be taken as an example of a material for forming the undercoat layer. Hafnium nitride (HfN), zirconium nitride (ZrN) or tantalum nitride (TaN) to be metal nitride takes an identical or close crystal structure to the titanium nitride. Furthermore, a hexagon such as nitride niobium (NbN) or Vanadium nitride (VN) can also be taken. By causing the nitrogen component of the metal nitrides and their alloy nitrides to be rich, accordingly, it is possible to use the nitrogen component as the undercoat layer and to grow the group III nitride compound semiconductor directly thereon.

In order to form the undercoat layer, it is possible to utilize a method such as CVD (Chemical Vapor Deposition), for example, plasma CVD, thermal CVD or optical CVD, or PVD (Physical Vapor Deposition) such as sputtering, reactive sputtering, laser abrasion, ion plating, evaporation or an ECR method.

It is preferable that the thickness of a metal nitride layer should be set to be 5 nm to 10 μm.

In the case in which the metal nitride layer is to be separated from a substrate, the characteristic of the substrate is required for the metal nitride layer. For this reason, it is preferable that a thickness should be set to be equal to or greater than 50 μm. It is further preferable that the thickness should be set to be equal to or greater than 100 μm.

In order to separate the metal nitride layer from the substrate, it is preferable that a titanium layer should be formed therebetween. The titanium layer is removed by chemical etching using acid (aqua regia) after the completion of the semiconductor device or in the middle thereof.

It is possible to use, for the substrate, a hexagonal material such as sapphire, SiC (silicon carbide) and GaN (gallium nitride) or a cubic material such as Si (silicon), GaP (gallium phosphide) or GaAs (gallium arsenide).

In the case in which a sapphire substrate is employed, it is preferable to use an "a" surface thereof. Consequently, the flatness of the group III nitride compound semiconductor layer can be enhanced still more.

In the case in which SiC, GaN, silicon, GaP or GaAs is used as the substrate, a conductivity can be added to the substrate. Moreover, titanium nitride, hafnium nitride, zirconium nitride and tantalum nitride have conductivities respectively. As a result, an electrode can be formed on both sides of a semiconductor device. Thus, the number of device manufacturing steps can be decreased so that a cost can be reduced.

Since the metal nitride has a comparatively low rigidity, furthermore, it also has the function of relieving a distortion (an internal stress) caused by a difference in a grating constant between the sapphire substrate and the group III nitride compound semiconductor layer and a difference in a coefficient of thermal expansion.

The group III nitride compound semiconductor is expressed, in a general formula, as $Al_XGa_YIn_{1-X-Y}N$ ($0 \leq X \leq 1$, $0 \leq Y \leq 1$, $0 \leq X+Y \leq 1$), and contains a so-called binary system such as AlN, GaN and InN and a so-called ternary system such as $Al_xGa_{1-x}N$, $Al_xIn_{1-x}N$ and $Ga_xIn_{1-x}N$ ($0<x<1$). A part of the group III element may be substituted for boron (B) or thallium (Tl), and furthermore, a part of nitrogen (N) may be substituted for phosphorus (P), arsenic (As), antimony (Sb) or bismuth (Bi). The group III nitride compound semiconductor layer may contain an optional dopant. For an n-type impurity, it is possible to use Si, germanium (Ge), selenium (Se), tellurium (Te) and carbon (C). For a p-type impurity, it is possible to use magnesium (Mg), zinc (Zn), beryllium (Be), calcium (Ca), strontium (Sr) and barium (Ba). It is also possible to dope the p-type impurity and to then expose the group III nitride compound semiconductor to an electron beam irradiation, a plasma irradiation or heating by a furnace. While the method of forming the group III nitride compound semiconductor layer is not particularly restricted, the formation can also be carried out by a molecular beam crystal growth (an MBE method), a halide vapor-phase growth (an HVPE method), a sputtering method, an ion plating method and an electron shower method which are well known in addition to an organic metal vapor-phase growth (an MOCVD method).

For the structure of a light emitting element, it is possible to use a homo structure having an MIS junction, a PIN junction or a pn junction, a single hetero structure or a double hetero structure. For a light emitting layer, it is also possible to employ a quantum well structure (a single quantum well structure of a multiple quantum well structure).

EXAMPLE 1

Figure 2A:
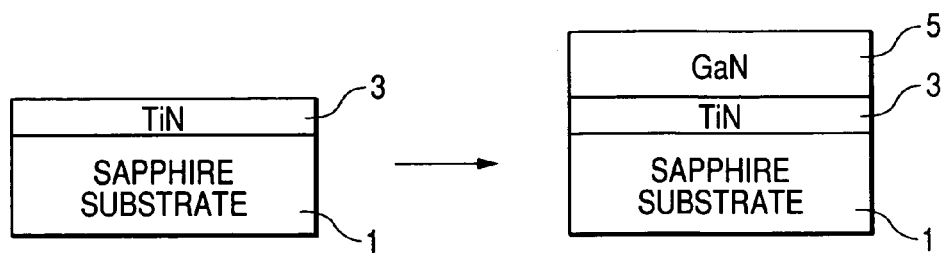
FIG. 2 is a view showing a method of forming the undercoat layer according to the invention.

As shown in FIG. 2A, a sapphire substrate 1 was prepared and an undercoat layer 3 formed of TiN was formed thereon by sputtering while regulating a Ti/N ratio. The thickness of the undercoat layer 3 was set to be 100 to 300 nm.

Then, a GaN layer 5 (a thickness: approximately 2 μm) was formed by an MOCVD method. The result of the flatness of the GaN layer 5 is shown in Table 1.

In the Table 1, ⊚ represents a flatness with which a device can be used, ○ represents a flatness, Δ represents a slight step, and X represents the island-like growth of GaN. A decision was visually carried out.

TABLE 1

| Undercoat layer | | | Sapphire substrate | |
|---|---|---|---|---|
| $Ar/N_2$ ratio | Growth temperature | Color | "a" surface | "c" surface |
| 9.5/0.5 | 800° C. | silver | X | X |
| 9.5/0.5 | 600° C. | silver | Δ | X |
| 9.0/1.0 | 600° C. | silver | Δ | X |
| 8.0/1.0 | 600° C. | reddish brown | Δ | Δ |

Figure 2B:
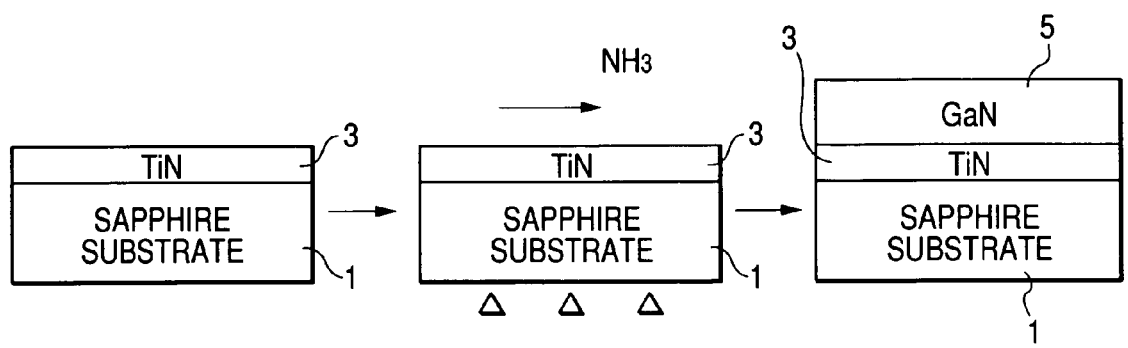

In a process shown in FIG. 2B, the undercoat layer 3 is subjected to nitriding in the process shown in FIG. 2A. In the example, approximate seven minutes were taken to raise the temperature of the substrate to 1130° C. while an ammonia gas was caused to flow in an amount of 15 slm, and was then cooled (30 minutes were taken for the cooling in the experiment facilities of the inventors). The result is shown in Table 2.

TABLE 2

| Undercoat layer (nitrided) | | | Sapphire substrate | |
|---|---|---|---|---|
| $Ar/N_2$ ratio | Growth temperature | Color | "a" surface | "c" surface |
| 9.5/0.5 | 600° C. | silver | Δ | X |
| 9.0/1.0 | 600° C. | reddish brown | ○ | Δ |
| 8.0/2.0 | 600° C. | reddish brown | ○ | ○ |
| 6.0/4.0 | 600° C. | reddish brown | ⊚ | ⊚ |

Figure 3A:
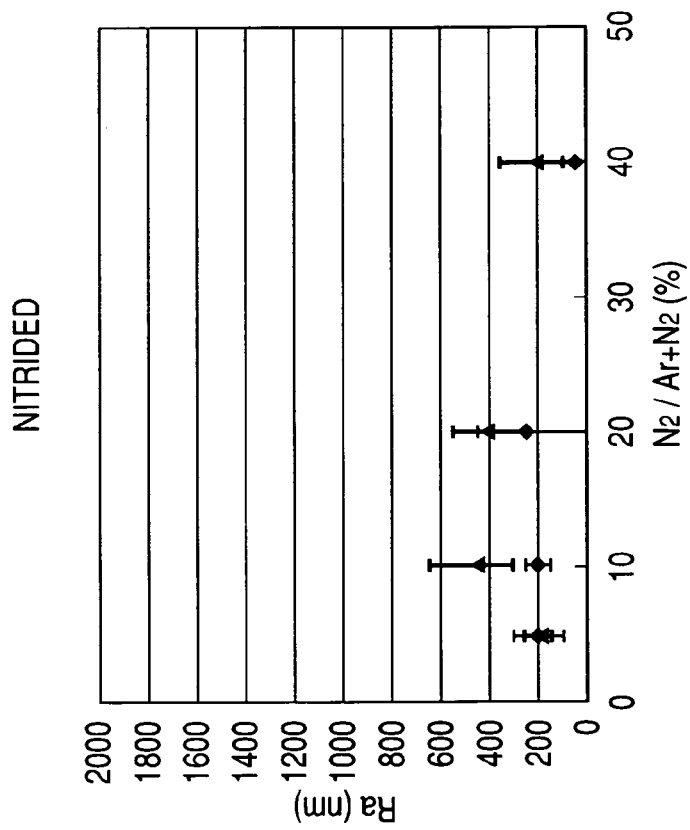
FIG. 3 is a chart showing a relationship between the condition of the formation of the undercoat layer and the surface roughness of a GaN layer.
Figure 3B:
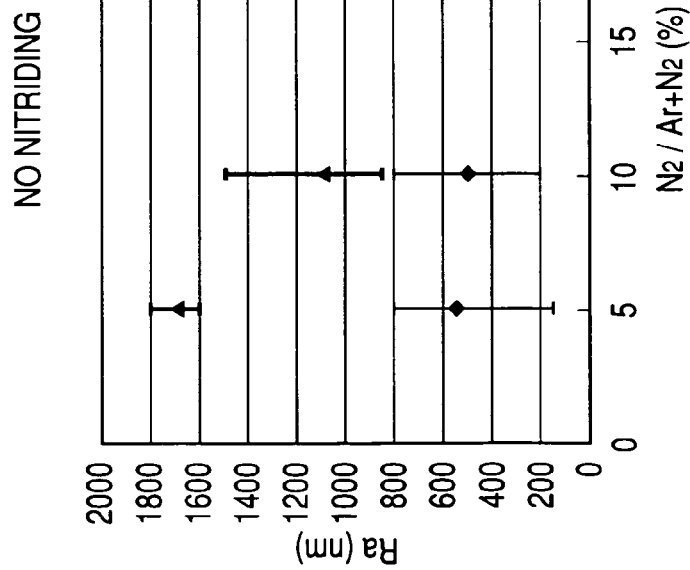

FIG. 3 shows a result obtained by measuring the surface roughness (Ra) of the GaN layer 5. The surface roughness was measured by scanning the surface of a sample by means of a very small probe using SHIMADZU SPM-9500J3.

From the Tables 1 and 2 and the result of FIG. 3, it is apparent that the color of the undercoat layer becomes reddish brown and the flatness of the GaN layer formed directly thereon can be enhanced when the rate of occupation of an N atom is increased in the undercoat layer formed of TiN. Moreover, it is apparent that the undercoat layer is preferably grown on the "a" surface when the sapphire substrate is used.

According to the investigations of the inventors, the GaN layer directly formed on the undercoat layer having the reddish brown color in the example has a threading dislocation decreased more greatly than a GaN layer formed on a low temperature buffer layer as in the conventional example. The reason is that a polarity is unified over the surface of the undercoat layer with which the group III nitride compound semiconductor layer comes in contact. It is apparent that the crystallinity of the GaN layer can also be enhanced by the decrease in the threading dislocation.

EXAMPLE 2

Figure 4:
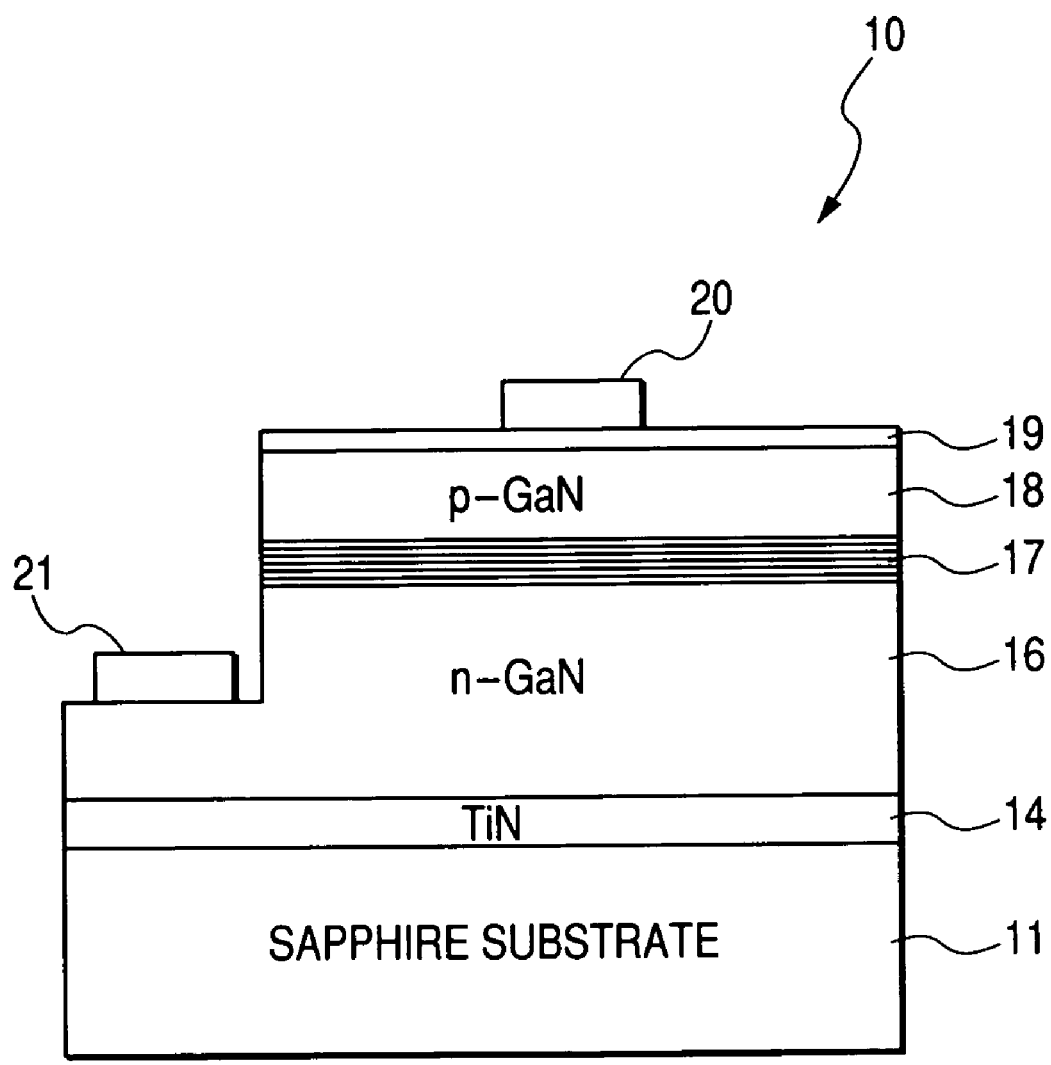
FIG. 4 is a view showing the structure of a light emitting element according to an example.

In the example, a light emitting diode 10 is used and a structure thereof is shown in FIG. 4.

The specification of each layer is as follows.

| Layer | Composition:Dopant (Film thickness) |
|---|---|
| p-clad layer 18 | p-GaN:Mg (0.3 μm) |
| Light emitting layer 17 | Multiple quantum well structure |
| Quantum well layer | $In_{0.15}Ga_{0.85}N$ (3.5 nm) |
| Barrier layer | GaN (3.5 nm) |
| Number of repetitions of quantum well layer and barrier layer: 1 to 10 | |
| n-clad layer 16 | n-GaN:Si (4 μm) |
| TiN layer 14 | TiN (100 nm) |
| Substrate 11 | Sapphire (300 μm) |

The n-clad layer 16 can have a two-layer structure formed by a low electron concentration n⁻ layer on the light emitting layer 17 side and a high electron concentration n⁺ layer on a buffer layer 15 side. The latter is referred to as an n-type contact layer.

The light emitting layer 17 is not restricted to a superlattice structure. For the structure of the light emitting element, it is possible to use a single hetero type, a double hetero type and a homo junction type. Moreover, it is also possible to employ a single quantum well structure.

An $Al_XIn_YGa_{1-X-Y}N$ (including X=0, Y=0, X=Y=0) layer doped with an acceptor such as magnesium and having a wide band gap can be provided between the light emitting layer 17 and the p-clad layer 18. This is carried out in order to prevent an electron injected into the light emitting layer 17 from being diffused into the p-clad layer 18.

The p-clad layer 18 can have a two-layer structure formed by a low hole concentration p⁻ layer on the light emitting layer 17 side and a high hole concentration p⁺ layer on an electrode side. The latter is referred to as a p-type contact layer.

The TiN layer 14 is formed on the "a" surface of the sapphire substrate by a reactive magnetron sputtering method. At this time, the temperature of the substrate is 600° C. and the flow rate of an Ar gas and a nitrogen gas is 6:4. Then, the sample is moved to an MOCVD device and an ammonia gas is caused to flow into a chamber, and at the same time, the temperature of the substrate is raised to 1100° C. to carry out nitriding over the TiN layer 14. Thereafter, a hydrogen gas is caused to flow into the chamber and a pretreatment is thus carried out in a state in which the temperature of the substrate is maintained.

Subsequently, the temperature is maintained to be 1100° C. and the group III nitride compound semiconductor layer after the n-clad layer 16 is formed in accordance with a conventional method (an MOCVD method). In the growth method, the ammonia gas and an alkyl compound gas to be a group III element, for example, trimethyl gallium (TMG), trimethyl aluminum (TMA) or trimethyl indium (TMI) are supplied onto the substrate heated to a proper temperature, and they are subjected to a thermolytic reaction and a desirable crystal is thus grown over the substrate.

The crystallinity of each of the group III nitride compound semiconductor layers 16 to 18 thus formed is preferable.

A light transmitting electrode 19 is a thin film containing gold and is laminated to cover the substantially whole upper surface of the p-clad layer 18. A p-electrode 20 is also constituted by a material containing the gold and is formed on the light transmitting electrode 19 by evaporation.

An n-electrode 21 is formed by the evaporation on the surface of the n-GaN layer 16 exposed by etching.

Figure 5:
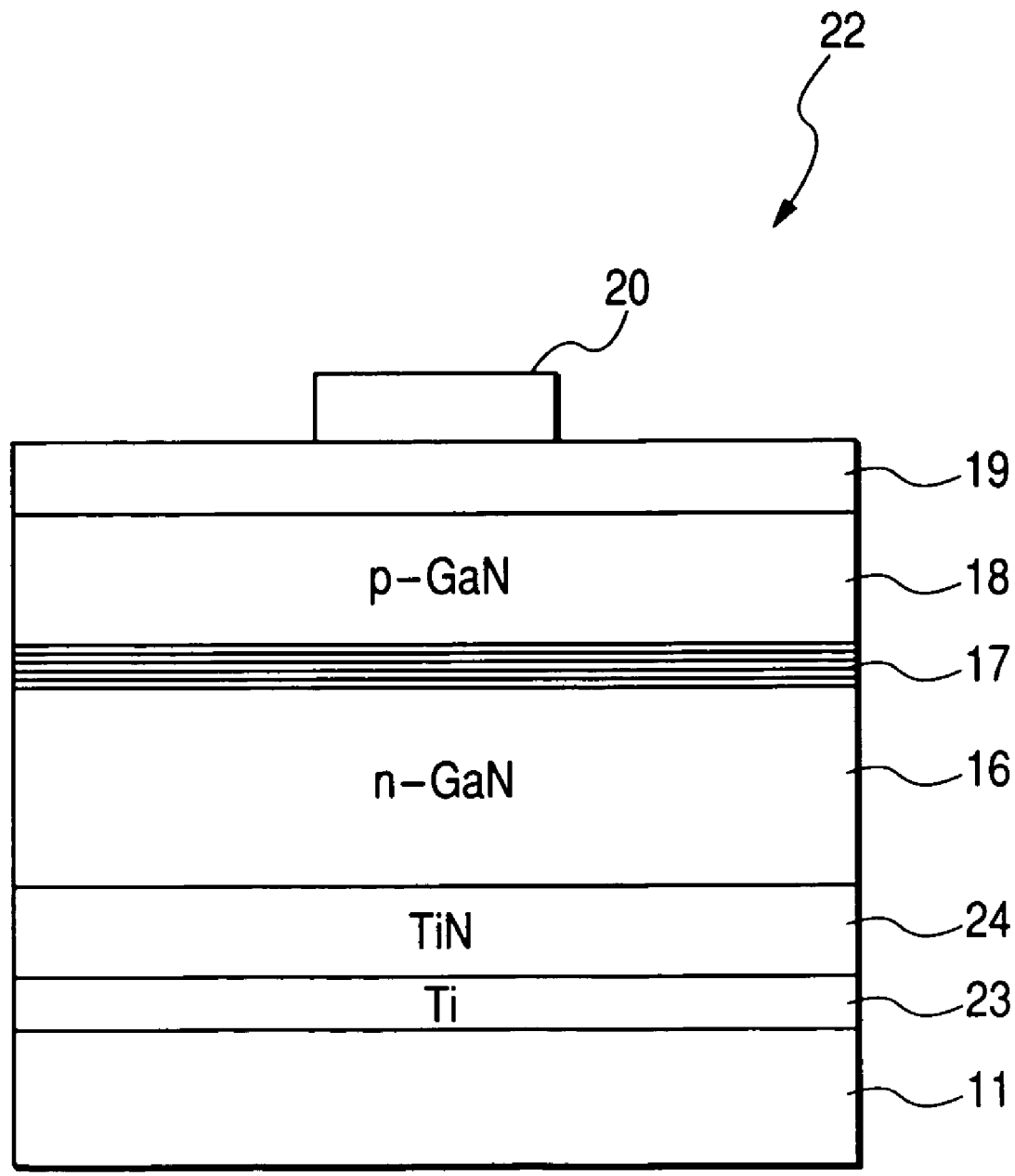
FIG. 5 is a view showing the structure of a light emitting element according to another example.

FIG. 5 shows a semiconductor light emitting element 22 according to another example. The same elements as those in FIG. 4 have the same reference numerals and description thereof will be omitted.

In the element shown in FIG. 5, a Ti layer 23 is provided between the sapphire substrate 11 and a TiN layer 24 to be a thick film. The Ti layer 23 is removed so that the TiN layer 24 to be the thick film becomes the substrate of the element. Since the TiN layer 24 has a conductivity, the semiconductor device 22 can take the conductivity in a vertical direction.

The invention is not restricted to the description of the embodiment and examples according to the invention. Various changed manners can also be included in the invention without departing from the claims and within a range which can easily be considered by the skilled in the art.

The semiconductor device according to the invention can be applied to a functional element such as a transistor in addition to a light emitting element such as a light emitting diode or a laser diode, or a light receiving element.

What is claimed is:

1. A semiconductor device comprising:
   a group III nitride compound semiconductor layer; and
   an undercoat layer comprising metal nitride,
   wherein the group III nitride compound semiconductor layer is formed on the undercoat layer without a low temperature grown buffer layer provided there between, and
   wherein the metal nitride comprises reddish brown titanium nitride richer in nitrogen by 10% to 20% than gold titanium nitride that causes a polarity of a surface of the undercoat layer to be unified.

2. The semiconductor device according to claim 1, further comprising a substrate,
   wherein the substrate comprises sapphire, silicone carbide, gallium nitride, silicon, gallium phosphide or gallium arsenide, and
   wherein the undercoat layer is formed on the substrate.

3. The semiconductor device according to claim 1, further comprising a sapphire substrate, wherein the undercoat layer formed of the titanium nitride is formed on an "a" surface of the sapphire substrate.

4. The semiconductor device according to claim 1, wherein the undercoat layer comprises titanium nitride, hafnium nitride, zirconium nitride or tantalum nitride, or their alloy.

5. The semiconductor device according to claim 1, wherein the thickness of the undercoat layer is 5 nm to 10 μm.

6. The semiconductor device according to claim 1, wherein the group III nitride compound semiconductor layer comprises $Al_XGa_YIn_{1-X-Y}N$ ($0 \leq X \leq 1$, $0 \leq Y \leq 1$, $0 \leq X+Y \leq 1$).

7. A semiconductor device comprising:

a group III nitride compound semiconductor layer; and an undercoat layer comprising metal nitride, wherein the group III nitride compound semiconductor layer is formed on the undercoat layer without a low temperature grown buffer layer provided there between, wherein the metal nitride comprises reddish brown titanium nitride richer in nitrogen by 10% to 20% than gold titanium nitride that causes a polarity of a surface of the undercoat layer to be unified, wherein the substrate comprises sapphire, silicon carbide, gallium nitride, silicon, gallium phosphide or gallium arsenide, wherein the undercoat layer is formed on the substrate, wherein the thickness of the undercoat layer is 5 nm to 10 μm, wherein the group III nitride compound semiconductor layer comprises $Al_XGa_YIn_{1-X-Y}N$ ($0 \leq X \leq 1$, $0 \leq Y \leq 1$, $0 \leq X+Y \leq 1$), and wherein the undercoat layer on the substrate has properties consistent with being formed by one of chemical vapor deposition and physical vapor deposition.

* * * * *